June 2, 1970 J. DONJON 3,516,006

AMPLIFIER ARRANGEMENT HAVING LOW VOLTAGE DRIFT
WITH TEMPERATURE VARIATION

Filed July 16, 1968 2 Sheets-Sheet 1

INVENTOR:
JACQUES DONJON

By Breitenfeld & Levine
ATTORNEYS

INVENTOR:
JACQUES DONJON
By Breitenfeld & Levine
ATTORNEYS

United States Patent Office 3,516,006

Patented June 2, 1970

3,516,006

AMPLIFIER ARRANGEMENT HAVING LOW VOLTAGE DRIFT WITH TEMPERATURE VARIATION

Jacques Donjon, Paris, France, assignor to Societe de Fabrication d'Instruments de Mesure (S.F.I.M.), a French company Filed July 16, 1968, Ser. No. 745,226

Claims priority, application France, July 19, 1967, 114,749; Mar. 12, 1968, 143,354

Int. Cl. H03f 3/68

U.S. Cl. 330—69 6 Claims

ABSTRACT OF THE DISCLOSURE

Arrangement includes two amplifiers, each having a first feed-back resistor connected between its output and one of its inputs, the output of each amplifier also being connected via a second, positive, feed-back resistor to the input of the other amplifier connected to the first feed-back resistor.

The present invention relates to an amplifier arrangement with amplifiers having low voltage drift with temperature variation.

In order to amplify voltages, amplifiers are employed in electronic circuitry. These amplifiers generally comprise a feed-back resistance connected between the output and an input of the amplifier and an input resistance, and are characterised by a large internal amplification coefficient and by a large input impedance, and are inexpensive to manufacture thanks to modern manufacturing techniques.

On the other hand, however, they have the disadvantage of having high voltage drift with temperature variation so that they cannot be used when the amplifier arrangements are subject to large temperature variation. It is then necessary to replace them by specially adapted amplifiers, whose cost is several times higher than that of a standard amplifier. One can reduce the voltage drift of these amplifiers by decreasing the value of the feedback resistance but at the expense of a corresponding diminution in effective gain.

An object of the present invention is to provide an amplifier arrangement having low voltage drift with temperature variation but without loss of effective gain.

Another object of the present invention is to provide an amplifier arrangement which will give simultaneously low voltage drift with temperature variation and an increased input impedance.

Yet another object of the present invention is to provide an amplifier arrangement having differential input and output with low voltage drift with temperature variation and with an increased input impedance.

The invention provides equally for an amplifier arrangement in which the gain is continuously variable.

It should be noted that one can obtain similar characteristics with a specially adapted amplifier but its construction will be much more complex.

According to the present invention there is combined in known manner two amplifiers known per se by establishing a feed-back circuit between the output of one of the amplifiers and an input of the other, and vice versa.

Embodiments of the present invention will now be described, by way of example, with reference to the accompanying drawings, in which.

Figure 1:
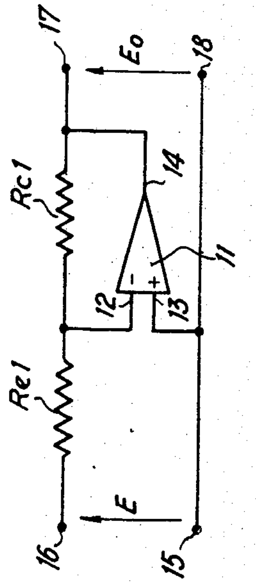
FIG. 1 shows a known amplifier arrangement using a standard or operational amplifier.

In FIG. 1 the reference numeral 11 refers to an operational or standard amplifier, for example a transistor amplifier. The amplifier 11 has two inputs 12, 13 and an output 14. The amplifier 11 has a high negative internal coefficient of amplification (—A). A feed-back circuit constituted by a feed-back resistance R*cl* of value R*c* connects the output 14 to the input 12. The electric signal E to be amplified is applied to the input terminals 12 and 13 through the intermediary of an input resistance R*el* of value R*e*. The signal E is applied to the terminals 15 and 16. At terminals 17 and 18 of the amplifier arrangement of FIG. 1 one obtains the output voltage E*o*.

By accepting that the internal- amplification coefficient of the amplifier 11 is substantial one obtains the following relationship for the effective gain of the arrangement $$\frac{Eo}{E}=\frac{Rc}{Re}$$

Figure 2:
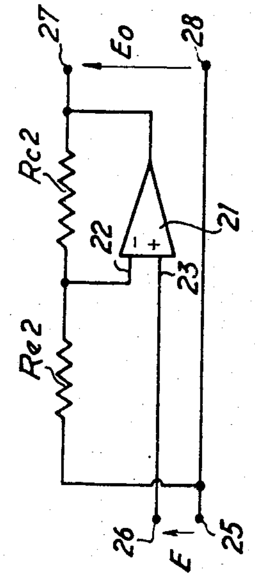
FIG. 2 shows another known amplifier arrangement again using a standard or operational amplifier.

The arrangement of FIG. 2 utilizes the same components as that of FIG. 1 but connected differently in circuit. In this case, the voltage E is applied between the terminals 25 and 26 and one obtains the voltage E*o* between the terminals 27 and 28. The effective gain is given by the equation $$\frac{Eo}{E}=+\frac{Rc+Re}{Re}$$

When the amplifier arrangements are subjected to variations in temperature, there occurs a variation in output voltage which is equal to $$Eo=\Delta E\left(1+\frac{Rc}{Re}\right)+\Delta I.Rc$$

where ΔE is the voltage drift which exists between the input of the amplifier arrangements and ΔI is the current drift between the output and the input of the amplifier across the resistance R*c*.

In this equation, the first term only becomes substantial for high effective gains. On the other hand, the second term is substantial for low effective gains. As the feed-back rate in these amplifier arrangements is generally high the effective gains are generally weak. In other words, the voltage drift results principally from the second term. In order to reduce the voltage drift with temperature variation it is therefore necessary to decrease the resistance R*c*. Such reduction is limited, however, by the fact that the input resistance R*e* must retain an acceptable value so that the effective gain shall not be too diminished.

Figure 4:
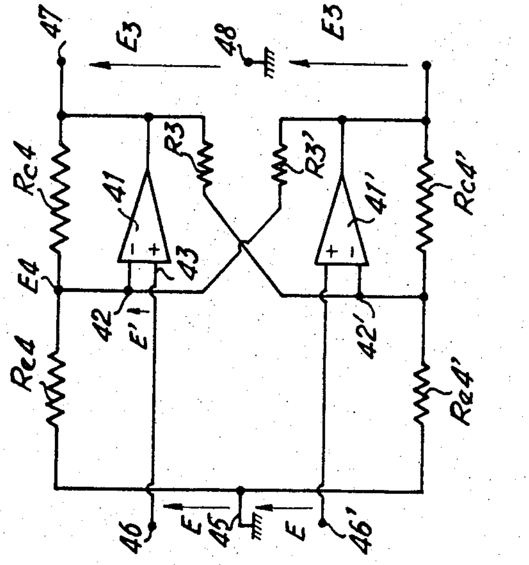
FIG. 4 shows another amplifier arrangement similar to FIG. 2 but according to the present invention.

According to the present invention one can obtain amplifier arrangements which satisfy these two opposite conditions. To this end, two operational and identical amplifiers are connected by applying a portion of the signal from the output of an amplifier to the input of the other amplifier to which is already applied the feed-back signal appropriate to this other amplifier and vice versa. By way of example, there is shown in FIGS. 3 and 4 such amplifier arrangements derived from the arrangements of FIGS. 1 and 2 respectively.

Figure 3:
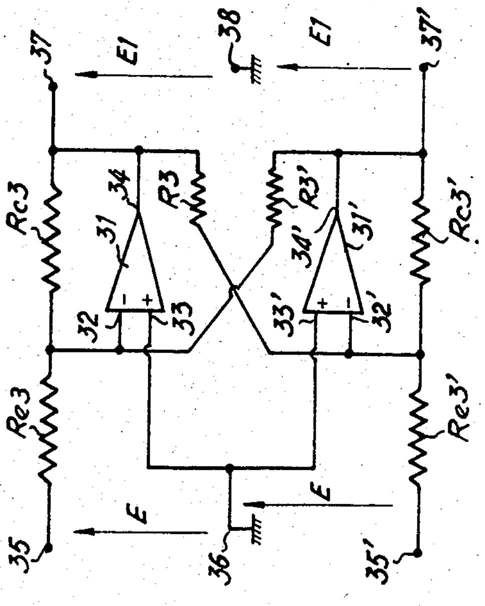
FIG. 3 shows an amplifier arrangement similar to FIG. 1 but according to the present invention.

In the arrangement of FIG. 3 two operational amplifiers 31 and 31' are used each of them being connected to resistances R*e*3, R*c*3 and R*e*3', R*c*3' respectively in the same manner as the amplifier 11 in FIG. 1. The input terminal is identical to the output terminal 38 and also to the input terminals 33 and 33' of the amplifiers 31 and 31'. These terminals correspond to the terminals 13, 15 and 18 in FIG. 1. The feed-back circuit according to the present invention is constituted by a resistance R3 of value R connected between the output terminal 34 of amplifier 31 and the input terminal 32' of the amplifier 31', on the one hand, and by the resistance R3' connected between the output terminal 34' of amplifier 31' and the input terminal 32 of amplifier 31. It will be noticed that the terminals 32, 32' are already those to which are applied the output signals of the amplifiers through the intermediary of resistances R*c*3 and R*c*3'. If one applies the voltage 2E (that is to say twice the voltage E) between the terminals 35 and 35', one obtains a voltage E1 between the terminals 38 and 37 and a voltage —E1 between the terminals 37' and 38. By referring to E2 as the voltage to the terminal 32 with reference to earth, one can write the equation of each circuit in the following manner:

$$\frac{E2-E}{Re}+\frac{E2-E1}{Rc}+\frac{E2-(-E1)}{R}=0$$

$$E2\left(\frac{1}{Re}+\frac{1}{Rc}+\frac{1}{R}\right)=\frac{E}{Rc}+\frac{E1}{Rc}-\frac{E1}{R}$$

but $$E2=-\frac{E1}{A}$$

A being very large, E2 is close to zero where $$\frac{E1}{E}=-\frac{Rc}{Re}\left\{\frac{1}{1-\frac{Rc}{R}}\right\}$$

Substituting $R=(1+k)Rc$ one obtains $$\frac{Rc}{R}=\frac{1}{1+k}$$

hence $$\frac{Eo}{E}=\frac{Rc}{Re}\left(\frac{1+k}{k}\right)$$

$k$ must be positive so as to avoid an unstable amplifier arrangement.

If one compares this equation with the expression for effective gain in FIG. 1 one can see that the value of effective gain is multiplied by $$\frac{1+k}{k}$$

Thus if $k=0.1$, the effective gain is multiplied by 11.

In other words, one can divide the value of the resistance R*c* by 11 to obtain the same effective gain and the same input resistance R*e* as in the arrangement of FIG. 1. The resistanee R*c* being divided by 11 the object of the invention is attained., since one thus reduces the voltage drift due to the current flowing across resistance R*c* (see formula above). When the assembly is used with an input to earth the loss in effective gain is 50%. In this case, one can re-establish the equilibrium by choosing a value of $k=5\%$.

Besides, there is produced an equalisation of output drift voltages by the intermediary of feed-back resistances. If the two amplifiers have equal voltage drifts, compensation is made in proportion of $1-k$. The voltage drift to the input is therefore practically eliminated.

The arrangement of FIG. 4 is derived from FIG. 2 in the same manner as that of FIG. 3 is derived from FIG. 1. By referring to E3 as the voltage between the terminals 47 and 48 and E4 the voltage to the point 42 and E' the voltage between the terminals 42, 43 one obtains the following equations:

$$\frac{E4-E3}{Rc}+\frac{E4}{Re}+\frac{E4-(-E3)}{R}=0$$

$$E4\left(\frac{1}{Rc}+\frac{1}{Re}+\frac{1}{R}\right)=\frac{E3}{Rc}-\frac{E3}{R}=E3\left(\frac{R-Rc}{Rc\cdot R}\right)$$

$$E'=-\frac{E3}{A}\quad E=E4+E'$$

If A is very large E' is negligible relative to E4 hence $$E\left(\frac{Rc+Re}{Re}\right)\cdot\frac{R}{R-Rc}+\frac{Rc}{R-Rc}=E3$$

With $R=1+k(Rc)$ one obtains $$\frac{E3}{E}=\left(\frac{1+k}{k}\right)\cdot\left(\frac{Re+Rc}{Re}+\frac{1}{1+k}\right)$$

When $k$ is small the term $$\frac{1}{1+k}$$

is very nearly equal to 1 hence $$\frac{E3}{E}=\left(\frac{1+k}{k}\right)\left(\frac{Rc}{Re}+1\right)$$

The relationship is thus multiplied by the same factor $$\frac{1+k}{k}$$

as in the case of the arrangement of FIG. 3. The voltage drift is therefore reduced in the same proportions.

Figure 5:
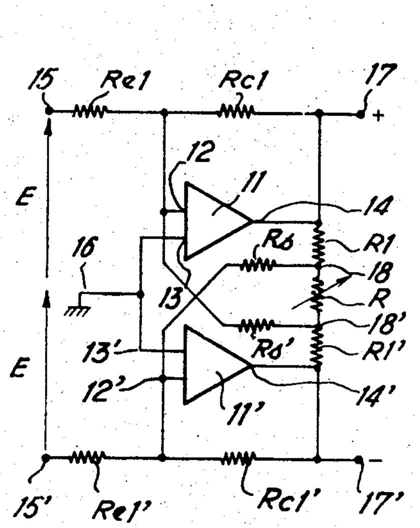
FIG. 5 shows a variation of the amplifier arrangement of FIG. 3.

The amplifier arrangements of FIGS. 3 and 4 can be realised by integrated circuitry. The cost of replacing these arrangements is noticeably less than that of a single amplifier possessing the same characteristics. In FIG. 5 the reference numerals less than 20 refer to the various components forming the amplifier arrangement in FIG. 3. This arrangement comprises two operational amplifiers 11 and 11' each possessing two inputs 12, 13 and 12', 13' and one output 14 and 14'.

With each amplifier there is associated a feed-back circuit composed of a resistance R*c*1, R*c*1', of value R*c*.

The voltage to be amplified 2E is applied between the principal input terminals 15, 15' each being connected to the input 12, 12' of the corresponding amplifier through the intermediary of an input resistance R*e*1, R*e*1' of value R*e*.

The input terminals 13 and 13' are connected to the earth terminal 16.

The output 14 of the amplifier 11 is connected to the input 12' of the amplifier 11' through a resistance R1 and a resistance R*s*; similarly the output 14' of the amplifier 11' is connected to the input 12 of the amplifier 11 through the resistances R1' and R*s*'. In addition, the junction 18 of resistances R1, R*s* and the junction 18' of resistances R1' and R*s*' are connected through a variable resistance R. One can consider that the resistance R has been connected each time to an intermediary point of the feed-back resistance in FIG. 3. In order to facilitate manufacture, the intermediate point is constituted by the junction of two separate resistances. This intermediate point is chosen so that $R1=R1'$, $Rs=Rs'$.

The output voltage (2E*o*) is obtained between the terminals 17, 17'.

By virtue of the feed-back circuit established in accordance with the invention one can take $Rc1=Rs=Rc$.

The voltage at 18 is designated by +U, that at 18' being designated by —U.

The terminals 12, 12' respectively are at the potential E1, E2. One then has $$\frac{E1-E}{Re}+\frac{E1-E0}{Rc}+\frac{E1-(-U)}{Rc}=0$$

$$E1\left(\frac{1}{Re}+\frac{2}{Rc}\right)=\frac{E}{Re}+\frac{E0}{Rc}-\frac{U}{Rc}$$

but $$E1=-\frac{E0}{A}=0$$

if A is very large, which is the case, hence $$\frac{E}{Re}+\frac{E0}{Rc}\left(1-\frac{U}{E0}\right)=0$$

and $$\frac{E0}{E}=-\frac{Rc}{Re}\frac{1}{\left(1-\frac{U}{E0}\right)} \qquad (1)$$

Figure 6:
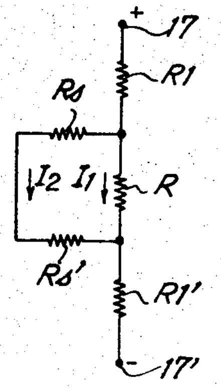
FIG. 6 shows a circuit similar to the feed-back circuit of the amplifier arrangement of FIG. 5.

FIG. 6 represents a circuit equivalent to the feed-back circuit of the arrangement in FIG. 5 in which the current flowing in the resistance R is designated by $I_1$ and that in resistance $R_s$, $R_s'$ by $I_2$.

In this circuit:

$$2R_1(I_1+I_2)+RI_1=2Eo$$

$$RI_1=2RcI_2=2U$$

$$I_2=\frac{R}{2Rc}I_1 \qquad I_1=\frac{2U}{R}$$

hence $$\left(2R_1\left(1+\frac{R}{2Rc}\right)+R\right)\frac{2U}{R}=2Eo$$

$$\frac{2R_1}{R}+\frac{R_1}{Rc}+1=\frac{Eo}{U}$$

$$\frac{1}{\left(1-\frac{U}{Eo}\right)}=\frac{Eo/U}{Eo/U-1}=1+\frac{1}{\frac{2R_1}{R}+\frac{R_1}{Rc}}=1+\frac{R}{2R_1\left(1+\frac{R}{2Rc}\right)}$$

and the general Equation 1 becomes:

$$\frac{Eo}{E}=-\frac{Rc}{Re}\left(1+\frac{R}{2R_1\left(1+\frac{R}{2Rc}\right)}\right)$$

But the relationship $R/2Rc$ is fixed and determined independently of the arrangement. The gain $Eo/E$ is therefore determined by the relationship $R/2R_1$ in which R is variable and $R_1$ is fixed.

Figure 7:
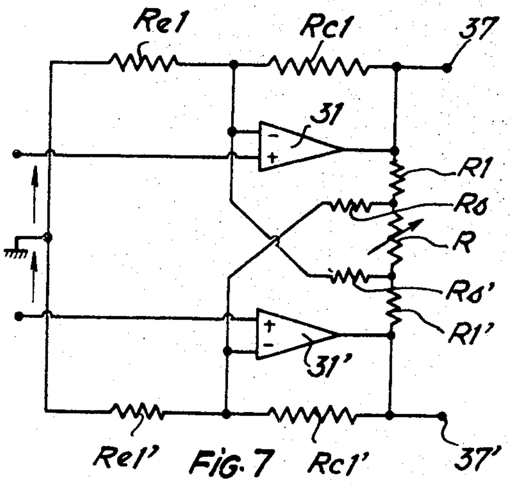
FIG. 7 shows a variant of the amplifier arrangement of FIG. 4.

One can therefore rarely gain continuously by varying R being given that the gain is determined by the rate of feed-back which is precisely $R/2R_1$. It has already been shown that in this arrangement the resistances $Rc$ and $Rs$ are equal. FIG. 7 shows a variation of the embodiment in FIG. 4 the corresponding components of the two figures bearing the reference numerals less than 10.

The explanation given for the operation of the arrangement of FIG. 5 is valid also for the arrangement of FIG. 7 and it is not necessary to repeat it.

I claim:

1. An amplifier arrangement comprising two terminals of a first differential input; two terminals of a second differential input; a first operational amplifier having an inverting input connected by an input resistance to one of said terminals of the first differential input, said first operational amplifier having a non-inverting input connected to the other terminal of the first differential input and having an output connected to a first output terminal of the arrangement; a second operational amplifier having an inverting input connected by an input resistance to one of said terminals of the second differential input, said second operational amplifier having a non-inverting input connected to the other terminal of the second differential input and having an output connected to a second output terminal of the arrangement; a negative feed-back resistance circuit connecting the inverting input of each of said first and second operational amplifiers to its own output; and a positive feed-back resistance circuit connecting the inverting input of each of said first and second operational amplifiers to the output of the other operational amplifier.

2. An amplifier arrangement according to claim 1 wherein the said other terminal of the first differential input which is connected to the non-inverting input of the first operational amplifier and the said other terminal of the second differential input which is connected to the non-inverting input of the second operational amplifier are a common terminal of the said differential inputs.

3. An amplifier arrangement according to claim 1 wherein the said terminal of the first differential input which is connected to the inverting input of the first operational amplifier and the said terminal of the second differential input which is connected to the inverting input of the second operational amplifier are a common terminal of the said differential inputs.

4. An amplifier arrangement according to claim 1 including a variable resistance connected between an intermediate point of one of said positive feed-back resistance circuits and an intermediate point of the other of said positive feed-back resistance circuits, so that the gain of the amplifier arrangement can be modified continuously by varying said variable resistance.

5. An amplifier arrangement according to claim 4 wherein each of said positive feed-back resistance circuits is divided at the said intermediate point of the circuit into two separate resistances.

6. An amplifier arrangement according to claim 4 wherein, for each operational amplifier, the resistance of the negative feed-back resistance circuit connecting the output and the inverting input of the operational amplifier is equal to the resistance of the said positive feed-back circuit between the said last-named inverting input and said intermediate point of the circuit.

References Cited

UNITED STATES PATENTS

| | | | |
|---|---|---|---|
| 3,046,487 | 7/1962 | Mateen et al. | 330—30 X |
| 3,188,576 | 6/1965 | Lewis | 330—30 X |
| 3,223,940 | 12/1965 | Early et al. | 330—306 XR |
| 3,419,809 | 12/1968 | Lach et al. | 330—84 X |

ROY LAKE, Primary Examiner

J. B. MULLINS, Assistant Examiner

U.S. Cl. X.R.

330—84